United States Patent
Nijaguna

(10) Patent No.: US 10,062,822 B1
(45) Date of Patent: Aug. 28, 2018

(54) LIGHT-EMITTING DIODE PACKAGE STRUCTURE WITH AN IMPROVED STRUCTURE, LIGHT-EMITTING DEVICE USING THE SAME, AND METHOD OF MAKING THE SAME

(71) Applicant: LITE-ON SINGAPORE PTE. LTD., Midview (SG)

(72) Inventor: Suresh Basoor Nijaguna, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 15/828,609

(22) Filed: Dec. 1, 2017

(51) Int. Cl.
  *H01L 33/00* (2010.01)
  *H01L 33/64* (2010.01)
  *H01L 33/48* (2010.01)
  *H01L 33/54* (2010.01)
  *H01L 33/60* (2010.01)

(52) U.S. Cl.
  CPC .......... *H01L 33/642* (2013.01); *H01L 33/486* (2013.01); *H01L 33/54* (2013.01); *H01L 33/60* (2013.01); *H01L 2224/4809* (2013.01); *H01L 2224/48228* (2013.01); *H01L 2933/0033* (2013.01)

(58) Field of Classification Search
  USPC .............. 257/13, 40, 79–103, 918, 257/E51.018–E51.022; 438/22–47, 69, 438/493, 503, 507, 956
  See application file for complete search history.

(56) References Cited

U.S. PATENT DOCUMENTS

| 2005/0051788 | A1* | 3/2005 | Tatsumi | H01L 33/32 257/99 |
| 2006/0097385 | A1* | 5/2006 | Negley | H01L 33/486 257/722 |
| 2009/0225544 | A1* | 9/2009 | Suzuki | F21K 9/00 362/249.01 |
| 2011/0012151 | A1* | 1/2011 | Ono | H01L 25/167 257/98 |
| 2011/0254032 | A1* | 10/2011 | Lee | H01L 33/486 257/98 |
| 2017/0244014 | A1* | 8/2017 | Park | H01L 33/62 |

* cited by examiner

*Primary Examiner* — Tram H Nguyen
(74) *Attorney, Agent, or Firm* — Li & Cai Intellectual Property (USA) Office

(57) ABSTRACT

A light-emitting diode package structure, a light-emitting device and a method of making the same are provided. The light-emitting diode package structure includes an insulating base, a first conductive unit, a second conductive unit and at least one light-emitting diode chips. The first conductive unit is disposed on the insulating base. The second conductive unit is disposed on the insulating base and separated from the first conductive unit. The at least one light-emitting diode chips is electrically connected to the first conductive unit and the second conductive unit. Further, the first conductive unit has a first groove, and an outer surface thereof is divided by the first groove into two separated parts. In addition, the second conductive unit has a second groove, and the outer surface thereof is divided by the second groove into two separated parts.

10 Claims, 7 Drawing Sheets

LIGHT-EMITTING DIODE PACKAGE STRUCTURE WITH AN IMPROVED STRUCTURE, LIGHT-EMITTING DEVICE USING THE SAME, AND METHOD OF MAKING THE SAME

BACKGROUND

1. Technical Field

The present disclosure is related to a light-emitting diode package structure, a light-emitting device and a method of making the same, and in particular to a light-emitting diode package structure, a light-emitting device and a method of making the same that limit solder reaching unintended portions of the light-emitting diode package structure, which affects the performance of the light-emitting diode.

2. Description of Related Art

Surface mounted light-emitting diode package structures have been widely applied in various portable electronic devices. Generally, light-emitting diode package structures could be mounted on printed circuit boards through reflow soldering processes by using solders.

However, there is still room for improvement in the design of the conventional light-emitting diode package structure.

SUMMARY

The object of the present disclosure is to provide a light-emitting diode package structure, a light-emitting device, and methods of making the same that prevent solder from reaching unintended portions of the light-emitting diode package structure such as light reflecting region.

In order to achieve the aforementioned object, according to one embodiment of the present disclosure, a light-emitting diode package structure is provided. The light-emitting diode package structure includes an insulating base, a first conductive unit, a second conductive unit and at least one light-emitting diode chips. The first conductive unit is disposed on the insulating base. The second conductive unit is disposed on the insulating base and separated from the first conductive unit. The at least one light-emitting diode chips is electrically connected to the first conductive unit and the second conductive unit. Further, the first conductive unit has a first groove, and an outer surface thereof is divided by the first groove into two separated parts. In addition, the second conductive unit has a second groove, and an outer surface thereof is divided by the second groove into two separated parts.

In order to achieve the aforementioned object, according to another embodiment of the present disclosure, a light-emitting device is provided. The A light-emitting device includes: a circuit board and a light-emitting diode package structure soldered on the circuit board by a solder, in which the light-emitting diode package structure includes: an insulating base, a first conductive unit, a second conductive unit and at least one light-emitting diode chips. The first conductive unit is disposed on the insulating base. The second conductive unit is disposed on the insulating base and separated from the first conductive unit. The at least one light-emitting diode chips is electrically connected to the first conductive unit and the second conductive unit. Further, the first conductive unit has a first groove, an outer surface of the first conductive unit is divided by the first groove into two first parts that are separated from each other, and the solder is blocked by the first groove, so as to prevent the solder from migrating from one of the two first parts to the other one of the two first parts. In addition, the second conductive unit has a second groove, an outer surface of the second conductive unit is divided by the second groove into two second parts that are separated from each other, and the solder is blocked by the second groove, so as to prevent the solder from migrating from one of the two second parts to the other one of the two second parts.

In order to achieve the aforementioned object, a method of making a light-emitting diode package structure is provided. The method includes: providing a light-emitting diode package, which includes: an insulating base, a first conductive unit disposed on the insulating base, a second conductive unit disposed on the insulating base and separated from the first conductive unit, and at least one light-emitting diode chips electrically connected to the first conductive unit and the second conductive unit; forming a first groove on the first conductive unit, wherein an outer surface of the first conductive unit is divided by the first groove into two separated parts; forming a second groove on the second conductive unit, wherein the outer surface of the second conductive unit is divided by the second groove into two separated parts.

In order to achieve the aforementioned object, a method of making a light-emitting device is provided. The method includes: providing a light-emitting diode package, which includes: an insulating base, a first conductive unit disposed on the insulating base, a second conductive unit disposed on the insulating base and separated from the first conductive unit, at least one light-emitting diode chips electrically connected to the first conductive unit and the second conductive unit; forming a first groove on the first conductive unit, wherein an outer surface of the first conductive unit is divided by the first groove into two first parts; forming a second groove on the second conductive unit, wherein the outer surface of the second conductive unit is divided by the second groove into two second parts; soldering the light-emitting diode package onto a circuit board with a solder, wherein the solder is prevented from migrating from one of the two first parts to the other one of the two first parts by the first groove, and wherein the solder is prevented from migrating from one of the two second parts to the other one of the two second parts by the second groove.

The advantages of the present disclosure is that the light-emitting diode package structure, the light-emitting device and the method of making the same according to the present disclosure can achieve the aforementioned object by the technical feature of "the first conductive unit has a first groove, and the outer surface of the first conductive unit is divided into two parts being separated from each other", and "the second conductive unit has a second groove, and the outer surface of the second conductive unit is divided into two parts being separated from each other", so as to prevent the solder from migrating from one of the two parts to the other.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are

DESCRIPTION OF THE EXEMPLARY EMBODIMENTS

Figure 1:
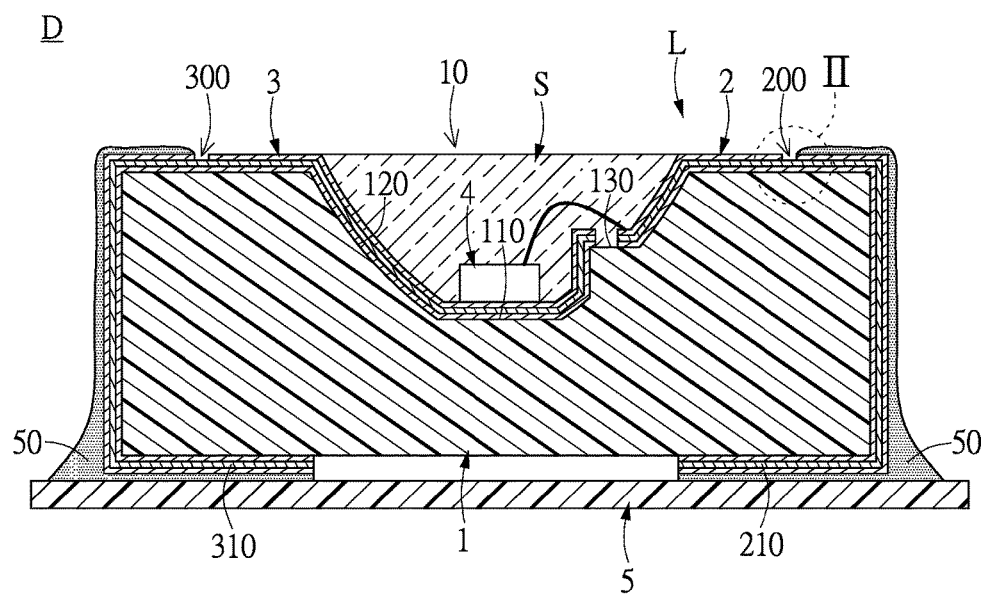
FIG. 1 is a cross-sectional view of a light-emitting device including a light-emitting diode package structure according to a first embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts. The present disclosure may be implemented or applied by various specific embodiments, and the details in this specification may be varied and modified without departing from the spirit of the present disclosure based on different views and applications. The drawings of the present disclosure are simply illustrative and are not depicted in terms of actual dimensions. The following description will further illustrate the related technical contents of the present disclosure, and should not be construed as restricting the technical scope of the present disclosure.

It should be noted that the terms "first", "second", "third", etc. may be used herein to describe various elements or signals, however such elements or signals should not be construed as limiting the terms. These terms are used to distinguish one element from another element, or to distinguish a signal from another signal. In addition, as used herein, the term "or" may include, as the case may be, all combinations of any one or more of the listed items.

First Embodiment

Referring to FIG. 1, a light-emitting diode package structure L and a light-emitting device D having the light-emitting diode package structure L are provided in the present embodiment. The light-emitting diode package structure L includes an insulating base 1, a first conductive unit 2, a second conductive unit 3 and at least one light-emitting diode chip 4.

The insulating base 1 can be made of insulation materials, such as plastics or ceramic, and be formed by plastic injection molding or compression molding. In the present embodiment, the insulating base 1 is formed by compression molding to achieve the required shapes and sizes. The insulating base 1 has an accommodating portion 10 depressed from the top surface of the insulating base 1 to the bottom thereof. As shown in FIG. 1, the accommodating portion 10 of the present disclosure has a flat bottom surface 110, a curved surface 120 and a step structure 130.

The first conductive unit 2 of the present disclosure is disposed on the insulating base 1; the second conductive unit 3 is disposed on the insulating base 1 and separated from the first conductive unit 2. The first conductive unit 2 and the second conductive unit 3 are formed on the surface of the insulating base 1 by plating or sputtering.

Figure 2:
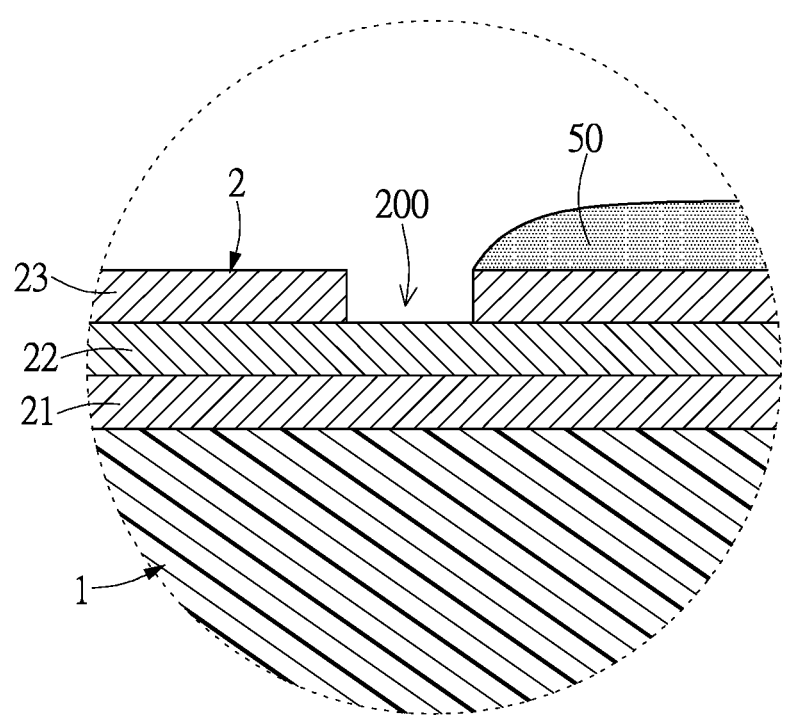
FIG. 2 is an enlarged image of one portion of the light-emitting device including the light-emitting diode package structure according to the first embodiment of the present disclosure.

The first conductive unit 2 and the second conductive unit 3 cover the top surface of the insulating base 1, respectively covering two sides of the insulating base 1 and extending to the bottom thereof, as shown in FIGS. 1 and 2. More specifically, the insulating base 1 is divided into a first region and a second region. The first conductive unit 2 covers the top surface of the insulating base 1 corresponding to the first region thereof and extends to the step structure 130 of the accommodating portion 10. The first conductive unit 2 has the first lead 210 that extends to the outer surface of the insulating base 1. In the present embodiment, the position of the first lead 210 is at the bottom of the insulating base 1, but may be varied according to practical needs.

Similarly, the second conductive unit 3 covers the top surface of the insulating base 1 corresponding to the second region, the curved surface 120 of the accommodating portion 10 and the flat bottom surface 110 of the accommodating portion 10 and extends toward the step structure 130. It should be noted that, although both covering a part of the step structure 130, the first conductive unit 2 and the second conductive unit 3 are separated from each other. The second conductive unit 2 has a second lead 310 that extends to the outer surface of the insulating base 1. The second lead 310 is at the bottom of the insulating base 1, but is not limited thereto.

The first conductive unit 2 and the second conductive unit 3 are separated from each other to achieve insulation. It should be noted that the boundary between the first region and the second region may be varied according to practical needs.

Referring to FIG. 2, which is an enlarged image of one portion from FIG. 1. As shown in FIG. 2, the first conductive unit 2 includes a first copper layer 21, a first nickel layer 22 and a first gold layer 23. The first nickel layer 22 is disposed on the first copper layer 21, which is disposed on the base 1, by plating or sputtering, the first gold layer 23 is disposed on the first nickel layer 22 by plating or sputtering. Similarly, the second conductive unit 3 includes a second copper layer 31, a second nickel layer 32 and a second gold layer 33. The second nickel layer 32 is disposed on the second copper layer 31 by plating or sputtering, the second gold layer 33 is disposed on the second nickel layer 32 by plating or sputtering. The copper layer and the nickel layer are mainly utilized as an electrical conductor, and the gold layer has higher light reflectivity for optical purpose inside the reflective bowl and good properties of wetting and adhering to solder. This property of gold of having good flow of solder along its surface is a key to develop good solder joint between the LED package and the PCB. The nickel layer is used for increasing the adhesion between copper and gold.

Referring to FIGS. 1 and 2, the first conductive unit 2 has a first groove 200, and the outer surface of the first conductive unit 2 is divided into two separate parts by the first groove 200; the second conductive unit 3 has a second groove 300, and the outer surface of the second conductive unit 3 is divided into two separate parts by the second groove 300. More specifically, in order to retain the electrical conductivity while at the same time preventing the solder from reaching unintended portions, e.g. the accommodating portion 10, the part of the first conductive unit 2 near the accommodating portion 10 and the part of the second conductive unit 3 near the accommodating portion 10, the first groove 200 is formed on the first gold layer 23, in which the first groove 200 divides the first gold layer 23 into the two separate parts and exposes the first nickel layer 22, and the second groove 300 is formed on the second gold layer 33 in which the second groove 300 divides the second gold layer 33 into two separate parts and exposes the second nickel layer 32. This way, solder is prevented from migrating across the first groove 200 and the second groove 300 and will stay around the edge of the top surface of the light-emitting device D. In the present embodiment, the etched grooves on the outer surface of the first conductive unit 2 and the second conductive unit 3 are formed by laser engraving in the present disclosure.

The depths of the grooves can be controlled in a predetermined depth, which is the thickness of the first gold layer 23 and the second gold layer 33, and the width thereof is between 20 μm and 40 μm. It should be noted that the widths of the grooves depends on the space availability, and are not limited to the above-mentioned range of width. In other embodiments, the depths of the first groove 200 and the second groove 300 can be slightly larger than the thickness of the first gold layer 23 and the second gold layer 33 so as to expose the first nickel layer 22 and the second nickel layer 32. In this embodiment, the depths of the first groove 200 and the second groove 300 are equal to the thickness of the first gold layer 23 and that of the second gold layer 33. Referring to FIG. 1, the first groove 200 and the second groove 300 are respectively disposed at two sides of the accommodating portion 10 corresponding to the top surface of the insulating base 1.

Furthermore, at least one light-emitting diode chip 4 is electrically connected to the first conductive unit 2 and the second conductive unit 3. As shown in FIG. 1, the light-emitting diode chip is electrically connected to the first conductive unit 2 at the step structure 130 through a wire. The number of the light-emitting diode chip 4 is exemplified as one in the present disclosure, but is not limited thereto. The light-emitting diode chip 4 of the present disclosure has an electrode on the bottom side thereof. The electrode can be an anode or a cathode, and can be fixed in position by conductive resins and electrically connected to the second conductive unit 3.

As aforementioned above, when the light-emitting diode package structure L is mounted on the circuit board 5 to form a light-emitting device D, the solder 50 climbs up along the surface of the first conductive unit 2 and the second conductive unit 3 respectively disposed on the two sides of the insulating base 1. Since the first groove 200 and the second groove 300, which expose the first nickel layer 22 and the second nickel layer 32 respectively, are disposed on the first conductive unit 2 and the second conductive unit 3, the solder 50, which has the ability to flow all over gold surface will stop flowing on the edge of the grooves. Hence, the present invention can prevent the solder 50 from migrating from one part to the other part of the first conductive unit 2 and the second conductive unit 3 so as to prevent the solder 50 from migrating into the unintended portions, i.e. accommodating portion 10 and the part of the first conductive unit 2 and of the second conductive unit 3 that are near the accommodating portion 10, and affecting the optical and luminous efficiency. Meanwhile, the amount of the solder on the first conductive unit 2 and the second conductive unit 3 is reduced.

It has been practically established that the solder flow along the surface of gold is so strong that it can seep under the silicone or other encapsulating materials, affecting the optical properties of the reflective gold layer and the reliability of the adhesion of the encapsulating materials thereto. Therefore, the probability of delaminating encapsulating materials such as clear silicone or clear epoxy located at the accommodating portion 10, i.e. the encapsulating unit S shown in FIG. 1, by solder flowing along the first gold layer 23 and the second gold layer 33 can be prevented.

Figure 3:
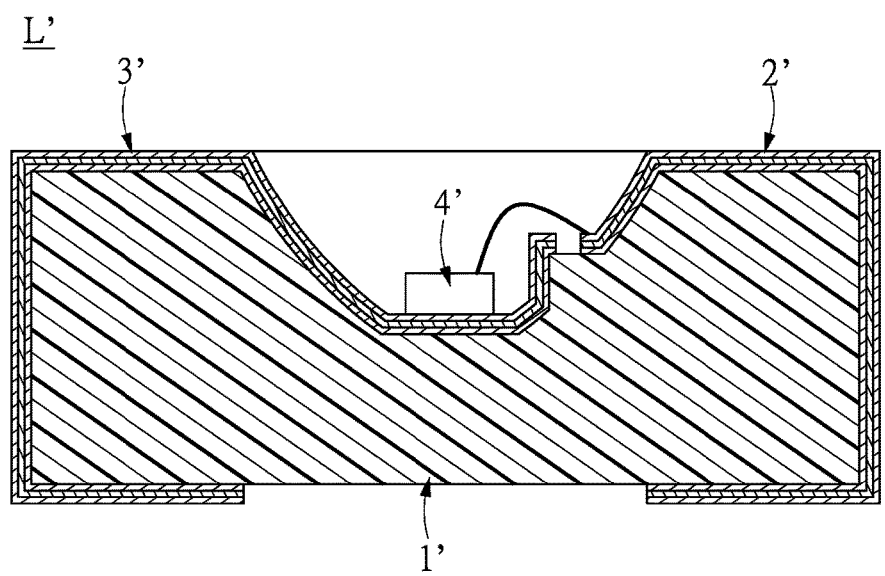
FIG. 3 is a schematic view illustrating the light-emitting diode package according to the method of making the light-emitting device of the first embodiment.
Figure 4:
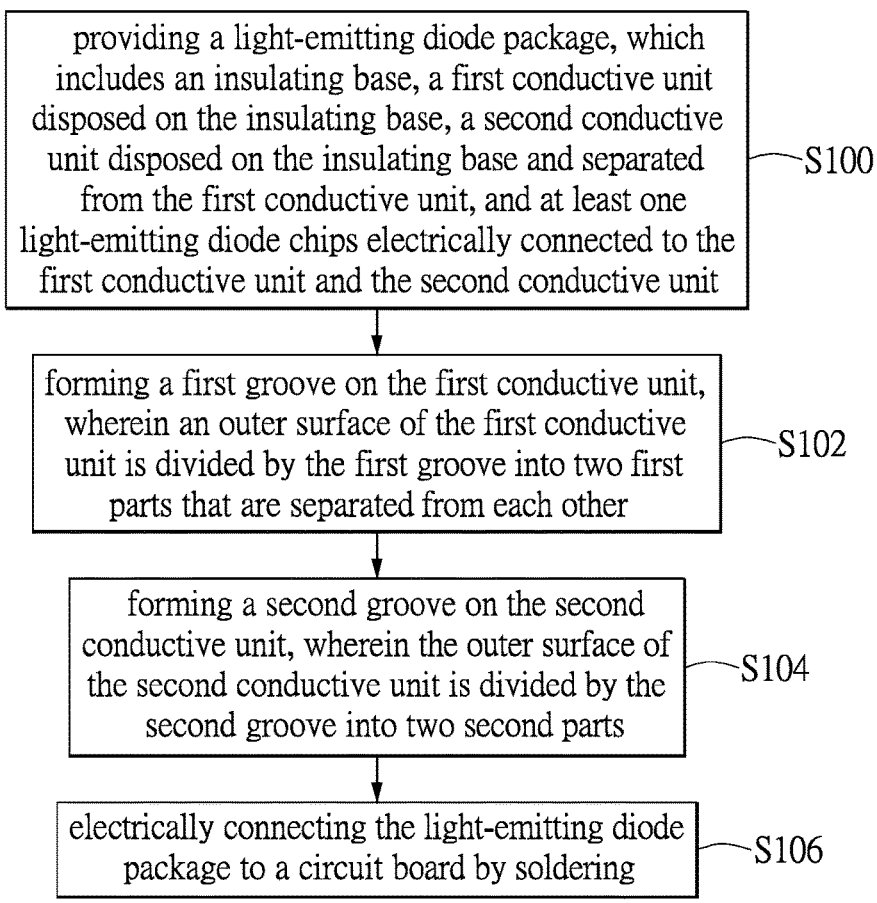
FIG. 4 is a flow chart illustrating the method of making the light-emitting device of the first embodiment.

Referring to FIGS. 3 and 4, the method of making the light-emitting device D of the present disclosure will be described below. First, with reference to FIG. 3, the method of making the light-emitting device D of the present disclosure includes a step S100: providing a light-emitting diode package L', in which the light-emitting diode package L' includes an insulating base 1', a first conductive unit 2' disposed on the insulating base 1', a second conductive unit 3' disposed on the insulating base 1' and separated from the first conductive unit 1', and at least one light-emitting diode chip 4'.

Next, with reference to FIGS. 1 and 2, the method further includes: a step S102 of forming a first groove 200 on the first conductive unit 2, in which the first conductive unit 2 is divided by the first groove 200 into two first parts separated from each other; and a step S104 of forming a second groove 300 on the second conductive unit 3, in which an outer surface of the second conductive unit 3 is divided by the second groove 300 into two second parts that are separated from each other.

Lastly, the method further includes a step S106 of electrically connecting the light-emitting diode package L to a circuit board 5 by soldering. More specifically, the light-emitting diode package L is soldered onto the circuit board 5 through a solder 50, in which the solder 50 is prevented by the first groove 200 from migrating from one of the two first parts to the other one of the two first parts, and prevented by the second groove 300 from migrating from one of the two second parts to the other one of the two second parts.

In the present embodiment, step S102 and step S104 are respectively performed by a laser-etching process. Through the laser-etching process, a portion of the first gold layer 23 and a portion of the second gold layer 33 are etched away and the first groove 200 and the second groove 300 are thus formed.

In summary, the present embodiment can achieve the effect of preventing the solder from migrating from soldered leads to unintended portions such as the accommodating portion 10 and the parts of the first and second conductive units (2, 3) near the accommodating portion 10, and affecting illumination efficiency, and can thus retain the predetermined reflective contour and surface finish of the accommodating portion 10 to conserve the intended path of emitted light rays for consistent performance. Furthermore, the light-emitting device D, the light-emitting diode package structure thereof and the method of making the same can prevent changes in the homogeneous reflectivity of the surface of the gold layers to conserve the intended intensity of emitted light to maintain uniformity and accuracy in performance. Moreover, in addition to the above-mentioned advantages, by the aforementioned technical solutions, the present invention can also prevent degradation in part reliability, which happens when solder seeps under the encapsulation material, i.e. the encapsulating unit S, making gaps for entry of moisture and other contaminants

Second Embodiment

Figure 5:
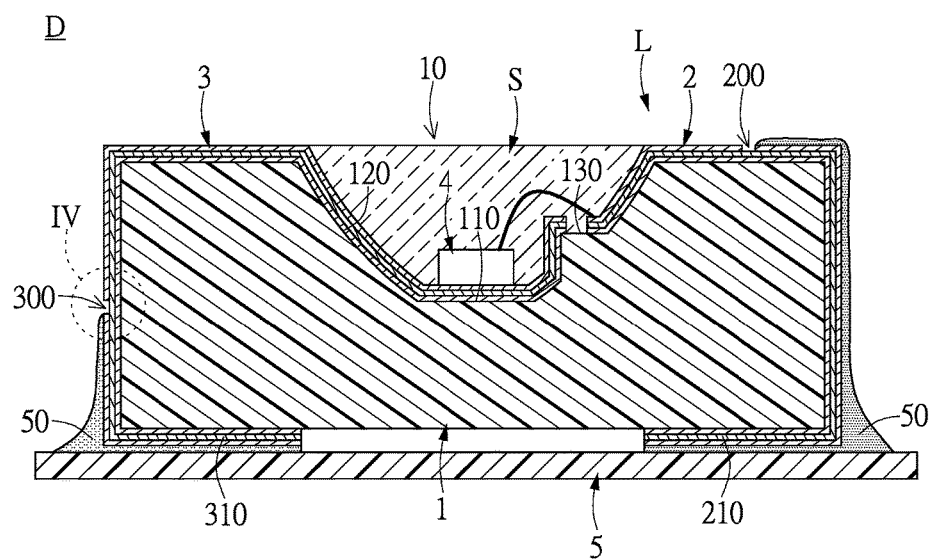
FIG. 5 is a cross-sectional view of the light-emitting device including the light-emitting diode package structure according to a second embodiment of the present disclosure.
Figure 6:
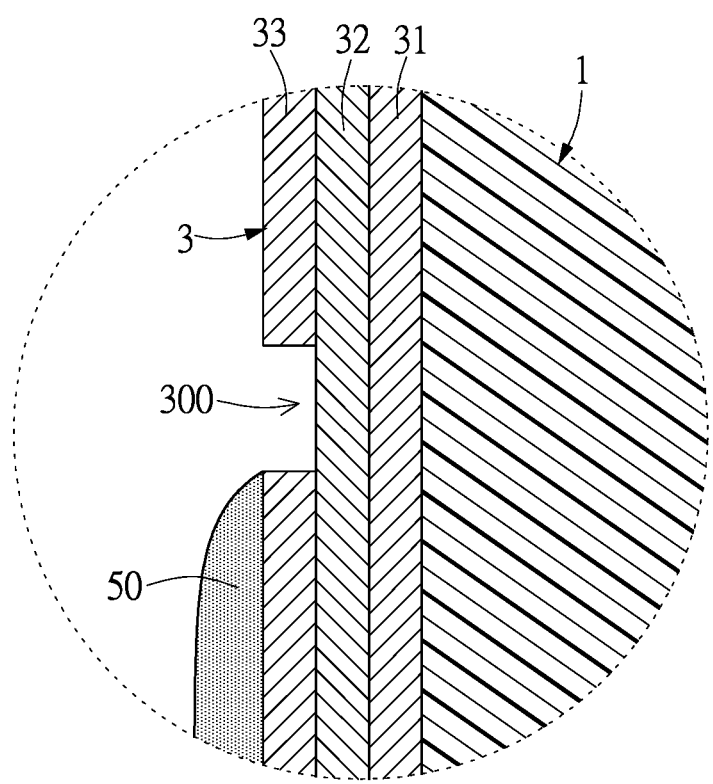
FIG. 6 is an enlarged image of one portion of the light-emitting device including the light-emitting diode package structure according to the second embodiment of the present disclosure.

Referring to FIG. 5 and FIG. 6, according to the second embodiment of the present disclosure, a light-emitting diode package structure L and a light-emitting device D having the light-emitting diode package structure L are provided. The light-emitting diode package structure L includes an insulating base 1, a first conductive unit 2, a second conductive unit 3 and at least one light-emitting diode chip 4. The light-emitting diode package structure L is mounted on the circuit board 5 to form the light-emitting device D. The light-emitting diode package structure L of the present embodiment is similar to that of the first embodiment. The difference between the two embodiments is that the position of the second groove 300 of the present embodiment is different from that of the first embodiment.

More specifically, according to the present embodiment, the first groove 200 is disposed on the first conductive unit 2 on top of the insulating base 1, and the second groove 300 is disposed on the outer surface of the second conductive unit 3 on one side of the insulating base 1. As in the first embodiment, the second conductive unit 3 includes a second copper layer 31, a second nickel layer 32 and the second gold layer 33, as shown in FIG. 6.

From the appearance of the light-emitting diode package structure L, the outer surface of the first conductive unit 2 is divided into two first parts that are separated from each other by the first groove 200, and the outer surface of the second conductive unit 3 is divided into two second parts that are separated from each other by the second groove 300. When the light-emitting diode package structure L is set on the circuit board 5 to form the light-emitting device D, since the first groove 200 and the second groove 300 have formed trenches that separate the first gold layer 23 and the second gold layer 33 of the first conductive unit 2 and the second conductive unit 3, the solder 50 climbing up from the first lead 210 and the second lead 310 to the first groove 200 and the second groove 300 will not flow into the first groove 200 and the second groove 300. Therefore, to the present disclosure can prevent the solder 50 from migrating from one of the two first parts divided by the first groove 200 to the other thereof, and from one of the two second parts divided by the second groove 300 to the other thereof.

In addition to the advantages that the first embodiment can achieve, by disposing the second groove 300 on one side of the light-emitting device D, the present embodiment can further prevent the increase in total height of the light-emitting device D caused by the solder 50 climbing up onto the top surfaces thereon. In other words, the present embodiment can stop the solder 50 from reaching the top surfaces of the light-emitting device D. In the technology markets where the space for assembly is very crucial, it is a major advantage to prevent the total height of the light-emitting device D from increasing due to the solder 50 flowing to the top surface.

Third Embodiment

Figure 7:
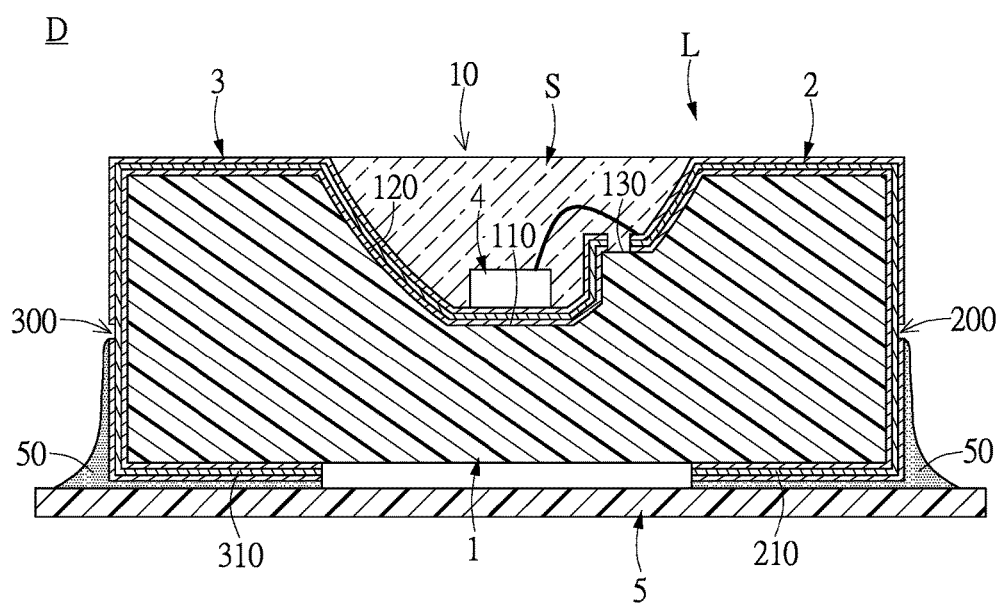
FIG. 7 is a cross-sectional view of the light-emitting device including the light-emitting diode package structure according to a third embodiment of the present disclosure.

Referring to FIG. 7, another light-emitting diode package structure L and a light-emitting device D having the light-emitting diode package structure L are provided according to the third embodiment of the present disclosure. The light-emitting diode package structure L includes an insulating base 1, a first conductive unit 2, a second conductive unit 3 and at least one light-emitting diode chip 4. The light-emitting diode package structure L is mounted on the circuit board 5 to form the light-emitting device D. The elements in the present embodiment are the same as those in the first and the second embodiments. The difference between the present embodiment and the previous two embodiments is that the first groove 200 and the second groove 300 are respectively disposed on the first conductive unit 2 and the second conductive unit 3 on two sides of the insulating base 1.

Furthermore, the first groove 200 divides the outer surface of the first conductive unit 2 into two separate first parts, and the second groove 300 divides the outer surface of the second conductive unit 3 into two separate second parts. When the light-emitting diode package structure L is set on the circuit board 5 to form the light-emitting device D, since the first groove 200 and the second groove 300 have formed trenches on the first conductive unit 2 and the second conductive unit 3, the solder 50 migrating from the first lead 210 and the second lead 310 to the accommodating portion 10 can be prevented.

In addition to the advantages the first and the second embodiments can achieve, by disposing the first groove 200 and the second groove 300 on sides of the light-emitting diode package structure L, the present embodiment can completely prevent the increase in total height of the light-emitting device D caused by the solder 50 climbing up onto the top surfaces thereon. In other words, the present embodiment can stop the solder 50 from reaching the top surfaces of the light-emitting device D. In the technology markets where the space for assembly is very crucial, it is a major advantage to prevent the total height of the light-emitting device D from increasing due to the solder 50 flowing to the top surface.

To sum up, an advantage of the present disclosure is that the light-emitting diode package structure L, the light-emitting device D and the method of making the same according to the present disclosure can prevent the solder 50 from migrating from one of the two parts to the other by the technical feature of "the first conductive unit 2 has a first groove 200, and the outer surface of the first conductive unit 2 is divided into two parts being separated from each other", and "the second conductive unit 3 has a second groove 300, and the outer surface of the second conductive unit 3 is divided into two parts being separated from each other".

Accordingly, through the technical solutions of the present disclosure, the light-emitting diode package structure L, the light-emitting device D, and the method of making the same can achieve the following advantages:

1: preventing the solder from migrating from soldered leads to unintended portions such as the accommodating portion 10 and parts of the first gold layer 22 and the second gold layer 32 near the accommodating portion 10, and affecting illumination efficiency, and can thus retain the predetermined reflective contour in the accommodating portion 10 to conserve the intended path of emitted light rays for consistent performance;

2. preventing changes in the homogeneous reflectivity of the surface of the gold layers to conserve the intended intensity of emitted light to maintain uniformity & accuracy in performance;

3. preventing degradation in part reliability; and 4. preventing the increase in total height of the light-emitting device caused by the solder climbing up onto the top surfaces thereon.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present invention delineated by the following claims.

What is claimed is:

1. A light-emitting diode package structure, comprising:
an insulating base;
a first conductive unit disposed on the insulating base;
a second conductive unit disposed on the insulating base and separated from the first conductive unit; and
at least one light-emitting diode chips electrically connected to the first conductive unit and the second conductive unit;
wherein the first conductive unit has a first groove, and an outer surface thereof is divided by the first groove into two first parts separated from each other, in which the outer surface of the first conductive unit is conductive;
wherein the second conductive unit has a second groove, and an outer surface thereof is divided by the second groove into two second parts separated from each other, in which the outer surface of the second conductive unit is conductive.

2. The light-emitting diode package structure according to claim 1, wherein the first conductive unit and the second conductive unit respectively cover two sides of the insulating base and extend to the bottom thereof.

3. The light-emitting diode package structure according to claim 1, wherein the first conductive unit includes a first copper layer, a first nickel layer disposed on the first copper layer, and a first gold layer disposed on the first nickel layer, in which the first groove is formed on the first gold layer, dividing the first gold layer into the two first parts and exposing the first nickel layer, wherein the second conductive unit includes a second copper layer, a second nickel layer disposed on the second copper layer, and a second gold layer disposed on the second nickel layer, in which the second groove is formed on the second gold layer, dividing the second gold layer into the two second parts and exposing the second nickel layer.

4. A light-emitting device, comprising:
a circuit board; and
a light-emitting diode package structure soldered on the circuit board by a solder, wherein the light-emitting diode package structure includes: an insulating base;
a first conductive unit disposed on the insulating base;
a second conductive unit disposed on the insulating base and separated from the first conductive unit; and
at least one light-emitting diode chips electrically connected to the first conductive unit and the second conductive unit;
wherein the first conductive unit has a first groove, an outer surface of the first conductive unit being divided by the first groove into two first parts that are separated from each other, in which the outer surface of the first conductive unit is conductive, and the solder being stopped by the first groove so as to prevent the solder from migrating from one of the two first parts to the other one of the two first parts;
wherein the second conductive unit has a second groove, an outer surface of the second conductive unit being divided by the second groove into two second parts that are separated from each other, in which the outer surface of the second conductive unit is conductive, and the solder being stopped by the second groove so as to prevent the solder from migrating from one of the two second parts to the other one of the two second parts.

5. The light-emitting device according to claim 4, wherein the first conductive unit and the second conductive unit respectively cover two sides of the insulating base and extend to the bottom thereof.

6. The light-emitting device according to claim 4, wherein the first conductive unit includes a first copper layer, a first nickel layer disposed on the first copper layer, and a first gold layer disposed on the first nickel layer, in which the first groove is formed on the first gold layer, dividing the first gold layer into the two first parts and exposing the first nickel layer; wherein the second conductive unit includes a second copper layer, a second nickel layer disposed on the second copper layer, and a second gold layer disposed on the second nickel layer, in which the second groove is formed on the second gold layer, dividing the second gold layer into the two second parts and exposing the second nickel layer.

7. A method of making a light-emitting diode package structure, comprising:
providing a light-emitting diode package, including:
an insulating base;
a first conductive unit disposed on the insulating base;
a second conductive unit disposed on the insulating base and separated from the first conductive unit; and
at least one light-emitting diode chips electrically connected to the first conductive unit and the second conductive unit;
forming a first groove on the first conductive unit, wherein an outer surface of the first conductive unit is divided by the first groove into two first parts that are separated from each other, in which the outer surface of the first conductive unit is conductive; and
forming a second groove on the second conductive unit, wherein an outer surface of the second conductive unit is divided by the second groove into two second parts that are separated from each other, in which the outer surface of the second conductive unit is conductive.

8. The method according to claim 7, wherein the first conductive unit includes a first copper layer, a first nickel layer disposed on the first copper layer, and a first gold layer disposed on the first nickel layer, in which the first groove is formed on the first gold layer, dividing the first gold layer into the two first parts and exposing the first nickel layer, wherein the second conductive unit includes a second copper layer, a second nickel layer disposed on the second copper layer, and a second gold layer disposed on the second nickel layer, in which the second groove is formed on the second gold layer, dividing the second gold layer into the two second parts and exposing the second nickel layer; and wherein the first groove and the second groove are formed by a laser-etching process.

9. A method of making a light-emitting device, comprising:
providing a light-emitting diode package, including:
an insulating base;
a first conductive unit disposed on the insulating base;
a second conductive unit disposed on the insulating base and separated from the first conductive unit; and
at least one light-emitting diode chips electrically connected to the first conductive unit and the second conductive unit;
forming a first groove on the first conductive unit, wherein an outer surface of the first conductive unit is divided by the first groove into two first parts that are separated from each other, in which the outer surface of the first conductive unit is conductive;
forming a second groove on the second conductive unit, wherein an outer surface of the second conductive unit is divided by the second groove into two second parts, in which the outer surface of the second conductive unit is conductive;

electrically connecting the light-emitting diode package to a circuit board by soldering.

10. The method according to claim 9, wherein the light-emitting diode package is soldered onto the circuit board through a solder, wherein the first conductive unit includes a first copper layer, a first nickel layer disposed on the first copper layer, and a first gold layer disposed on the first nickel layer, and the first groove is formed on the first gold layer, in which the first groove divides the first gold layer into the two first parts and exposes the first nickel layer, and the second conductive unit includes a second copper layer, a second nickel layer disposed on the second copper layer, and a second gold layer disposed on the second nickel layer, and the second groove is formed on the second gold layer, in which the second groove divides the second gold layer into the two second parts and exposes the second nickel layer; and wherein the first groove and the second groove are formed by a laser-etching process, and wherein the solder is prevented by the first groove from migrating from one of the two first parts to the other one of the two first parts, and prevented by the second groove from migrating from one of the two second parts to the other one of the two second parts.

* * * * *